United States Patent [19]
Murphy

[11] Patent Number: 5,794,784
[45] Date of Patent: Aug. 18, 1998

[54] TRAY FOR INTEGRATED CIRCUITS

[75] Inventor: Robert H. Murphy, Merrimack, N.H.

[73] Assignee: R. H. Murphy Co., Inc., Amherst, N.H.

[21] Appl. No.: 777,289

[22] Filed: Dec. 27, 1996

Related U.S. Application Data

[62] Division of Ser. No. 556,550, Oct. 10, 1995, which is a continuation of Ser. No. 165,255, Dec. 10, 1993, abandoned, which is a continuation of Ser. No. 843,622, Feb. 28, 1992, abandoned, which is a continuation-in-part of Ser. No. 587,966, Sep. 25, 1990, Pat. No. 5,103,976.

[51] Int. Cl.⁶ .................................................. B65D 73/02
[52] U.S. Cl. ........................... 206/725; 206/511; 206/562; 220/507
[58] Field of Search .................................. 206/701, 714, 206/716, 722, 724, 725, 726, 509, 511, 560, 562, 564, 565; 220/506, 507

[56] References Cited

U.S. PATENT DOCUMENTS

| | | | |
|---|---|---|---|
| 3,424,334 | 1/1969 | Goltz | 206/511 |
| 4,681,221 | 7/1987 | Chickanosky et al. | 206/328 |
| 4,762,606 | 8/1988 | Root | 206/701 |
| 4,767,984 | 8/1988 | Bakker | 324/158 |
| 4,928,820 | 5/1990 | Murphy et al. | 206/701 |
| 5,103,976 | 4/1992 | Murphy | 206/565 |
| 5,310,076 | 5/1994 | Burton et al. | 206/725 |
| 5,361,901 | 11/1994 | Schenz et al. | 206/714 |
| 5,370,225 | 12/1994 | Corey et al. | 206/722 |
| 5,547,082 | 8/1996 | Royer et al. | 206/722 |
| 5,584,717 | 12/1996 | Raddle et al. | 206/724 |

FOREIGN PATENT DOCUMENTS

| | | | |
|---|---|---|---|
| 358063 | 3/1990 | European Pat. Off. | 206/714 |
| WO 90/04915 | 5/1990 | WIPO | 206/714 |

*Primary Examiner*—Paul T. Sewell
*Assistant Examiner*—Nhan T. Lam
*Attorney, Agent, or Firm*—Pearson & Pearson

[57] ABSTRACT

A tray for storage and transportation of multiple pin grid array (PGA) integrated circuit components each having a planar housing and plurality of terminal pins arranged in spaced rows. The tray has a framework for supporting upstanding ribs that engage the integrated circuit component. Each upstanding rib lies along an axis in one of two sets of intersecting axes and aligns with and fits between certain spaced rows to support the bottom of the component.

32 Claims, 9 Drawing Sheets

TRAY FOR INTEGRATED CIRCUITS

CROSS REFERENCE TO RELATED APPLICATION

This is a division of my copending application Ser. No. 08/556,550 filed Oct. 10, 1995 for a Tray for Integrated Circuits which is a continuation of Ser. No. 08/165,255 filed Dec. 10, 1993 for a Tray for Integrated Circuits (now abandoned) which is a continuation of Ser. No. 07/843,622 filed Feb. 28, 1992 for a Tray for Integrated Circuits (now abandoned) which is a continuation-in-part of Ser. No. 07/587,966 filed Sep. 25, 1990 for a Tray for Integrated Circuits (now U.S. Pat. No. 5,103,976), which applications are all assigned to the same assignee as the present invention.

BACKGROUND OF THE INVENTION

1. Field of the Invention

This invention generally relates to integrated circuits and more specifically to devices for the storage and transport of such integrated circuits.

2. Description of Related Art

The storage and transportation of semiconductor components have become important considerations in the production of electronic assemblies, especially as semiconductor components have matured from inexpensive, elementary circuit elements into expensive, sophisticated, complex circuit components. As these components have grown in complexity, they have become more susceptible to damage from a number of external influences, such as mechanical shock and discharges of accumulated electrostatic charge. Consequently, there have been many changes in the transportation, assembly and testing procedures that in electronic assembly production facilities utilize. Such procedures, when properly implemented, now contribute significantly to the success of such electronic assembly facilities.

For example, in certain circumstances it is important to transport a component, such as an integrated circuit, pretest it, and provide ready access to the component for delivery to or insertion into a printed circuit board. "Chip carriers" now provide such functions for individual components. A "chip carrier" is a special fixture that houses and protects an individual component, such as an integrated circuit, from damage due to mechanical shock or electrostatic discharge during processing, production, testing and assembly operations. It also can orient an integrated circuit during the production process, assure proper placement and alignment of terminals for testing and for insertion into a printed circuit board.

In other circumstances, there may only be a requirement for the storage and shipment of large numbers of integrated circuits and like components without testing. For example, integrated circuit manufacturers ship such components to customers in bulk quantities. Some customers may desire to move such components in groups or sets directly to a printed circuit board. Other customers may desire to transport or store such components and then transfer the components to chip carriers or the like for further transportation and testing. When this limited requirement exists, it is difficult to justify the costs of purchasing and handling individual chip carriers.

There are a number of devices that store or carry semiconductor components and the like in a plurality of pockets. Examples of such devices are illustrated in the following U.S. Letters Patent:

3,469,686 (1969) Gutsche et al
3,482,682 (1969) Cronkhite
3,661,253 (1972) Cronkhite
3,946,864 (1976) Hutson
4,057,142 (1977) Lechner et al The Gutsche and both Cronkhite patents disclose a series of marginally registrable plastic trays. Each tray has a plurality of wells characterized by a tapered walls that support a single semiconductor wafer within each well. The tapered walls prevent a polished face of a wafer from contacting any surface of the tray. It is possible to nest or stack individual trays for shipment as a unit. Thus, these trays provide a means for the bulk storage and transportation of semiconductor wafers. The Cronkhite patents provide a removable cap member that is disposed upon a rim-forming element of each well. Each cap member has a recessed portion that engages an upwardly presented surface of a semiconductor wafer to hold the wafer in a substantially immobile position in the well.

The Hutson patent discloses a package for semiconductor chips with first and second transparent plastic sheets that each contain an array of discrete and spaced depressions. When the sheets are stacked, the depressions in adjacent sheets nest and form a plurality of discrete compartments for containing the semiconductor chips. The sheets attach to each other about their peripheries to form a package for transmitting the chips in bulk. Apertures through each plastic sheet in the region of the compartments are smaller than the chips and allow access for physical testing and visual inspection while the chips remain constrained within the compartments.

The Lechner et al patent discloses a plastic pallet with plural circular depressions formed for containing semiconductor disks on an individual basis. When individual pallets are stacked on top of one another in opposite directions, they position part sector surfaces so they slope alternatively upward and downward. The upward sloping surface in one pallet is immediately above a downward sloping surface in an adjacent pallet. These counterfacing surfaces clamp the edges of the semiconductor disk so the disk can be transported with substantially no abrasion between the semiconductor disks and the pallets.

Although the foregoing references disclose generally devices for storing semiconductor wafers, such wafers do not have terminal pins that are normally encountered in finished integrated circuits. These trays are not readily adapted to devices with terminal pins. The following United States Letters Patent do disclose devices for the shipment and transportation of integrated circuit components or for circuits utilizing such integrated circuit components:

4,210,243 (1980) McDowell
4,725,918 (1988) Bakker
4,792,042 (1988) Koehn et al

McDowell disclose a tray for holding integrated circuit packages of the transistor outline type. Such packages have cylindrical cases with preformed leads that flair radially outward from the bottom of the package. Flat portions of the free ends of the leads lie in a common plane. A tray for transporting a plurality of such packages has a top plate with a plurality of funnel shaped openings each having a cylindrical bottom portion for receiving a case. The top and bottom edges of the trays are dimensioned so that the top of a first tray nests inside the bottom of a second tray. When the nested trays are turned over, packages and openings in the first tray sit with the flat portions of their leads on the bottom of the second tray. A rim limits transverse movement of the packages set on the plate when the tray is shaken to cause them to fall into associated openings.

The Koehn et al patent discloses a chip carrier for individual electronic circuits. The chip carriers adapt for stacking for shipment. This enables a number of integrated circuit components to be shipped in bulk in a single package.

The Bakker patent discloses a box for storing electronic devices apparently including integrated circuits. The box includes a material that minimizes electrostatic accumulation and resultant discharges that could otherwise damage the electronic device.

Each of the foregoing references describes a device for use with a component of a single size or limited range of sizes. For example, semiconductor wafer and integrated circuit manufacturers use wafers of a given size or limited number of sizes. There are a limited number of transistor outline package sizes. As a result there is justification for the effort of designing specially formed trays or other devices according to the foregoing references.

However, these approaches do not adapt readily for the transportation and storage of pin grid array integrated circuit components. A pin grid array (PGA) integrated circuit component typically has a thin planar housing of a ceramic or other material for containing a semiconductor substrate and related circuitry. Terminal pins extend perpendicularly to one planar surface of the housing. The terminal pins define an array or matrix of columns and rows with an industry-standard spacing. Currently the spacing is 0.1 inch. PGA integrate circuit components come in myriad sizes that are defined alternatively by the size of the housing (from a 1-inch square to a 2.5-inch square) or by the size of the matrix (from a 9×9 terminal pin matrix to a 25×25 terminal pin matrix). Thus the adaption of a prior art design for accommodating PGA integrated circuit components would require a facility to inventory large number of specially sized trays.

A device for transporting and storing PGA integrated circuit components must also accommodate other characteristics inherent in such components. As previously indicated many electronic assembly facilities now utilize robotic devices to retrieve a component from a storage device, orient that component accurately and position and insert the component with respect to a printed circuit board or a chip carrier. It is critical for the robotic device to "know" the position of the pins. If the robotic device only "sees" the housing, placement errors can result. Although tight tolerances exist with respect to the relative positions of the terminal pins, only relaxed tolerances exist as to the position of the terminal pin array with respect to the housing. The prior art trays and devices rely on the engagement of a housing or wafer edge. If such devices were adapted to PGA components, there would be no direct repeatable correlation between the tray and the terminal pins.

It also is desirable that any device for transporting and storing PGA integrated circuit components provide other desirable benefits. For example, it is possible for any number of external forces to transfer to the terminal pins with force components directed along and transversely to the terminal pins. To some degree, the device should protect the terminal pins from damage due to such mechanical shock during transport. The device also should prevent the accumulation of an electrostatic charge on the PGA integrated circuit component to avoid a potential discharge and damage.

SUMMARY

Therefore it is an object of this invention to provide an economical device for the transportation and storage of electronic components, particularly pin grid array integrated circuit components.

Another object of this invention is to provide a device for storing and transporting electronic components, particularly pin grid array integrated circuit components, that accurately positions the terminal pins from such components.

Another object of this invention is to provide a storage and transportation device for electronic components, particularly pin grid array integrated circuit components, that protects terminal pins emanating from such components from mechanical shock.

Still another object of this invention is to provide a device for storing and transporting electronic components, particularly pin grid array integrated circuit components, that minimizes stresses that can be applied to terminal pins emanating from such components.

Yet another object of this invention is to provide a device for storing and transporting electronic components, particularly pin grid array integrated circuit components, that is stackable with similar devices thereby to enable the shipment and storage of a large number of components in a single package.

Yet still another object of this invention is to provide a device for storing and transporting electronic components, particularly pin grid array integrated circuit components, that facilitates both manual and automated handling techniques for such electronic components.

In accordance with this invention, a device for storing and transporting electronic components characterized by a housing and plurality of parallel terminal pins comprises a plurality of upstanding rib means that engage the component housing. Certain upstanding rib means lie on a first set of spaced parallel rib axes; others lie along a second set of spaced parallel rib axes. The first and second sets of rib axes intersect. A framework supports the upstanding rib means so the rib means engage and support the component with its terminal pins.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
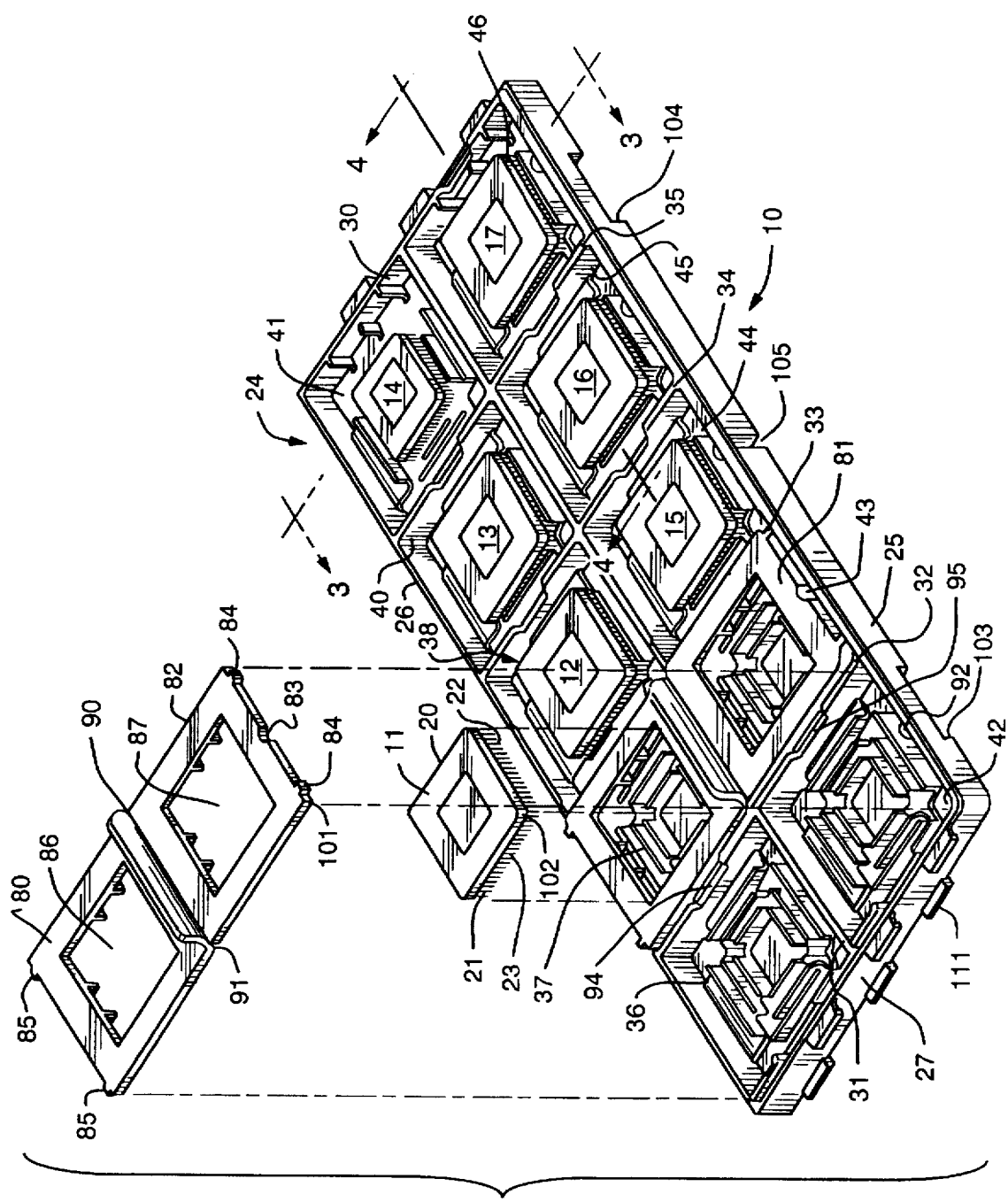
FIG. 1 is a perspective view of a device that is constructed in accordance with this invention for storing and transporting electronic components and a template for facilitating the manual placement of such components in the device.

A device for storing and transporting integrated circuit components or the like constructed in accordance with this invention comprises a tray 10 as shown in FIG. 1. In this particular embodiment the tray 10 carries a number of pin grid array integrated circuit components (called "PGA components" in the following description ) 11 through 17 at discrete locations. By way of example, the PGA component 11 has a planar ceramic housing 20 with a plurality of terminal pins 21 that extend transversely from a planar surface of the housing 20. In the orientation shown in FIG. 1, the terminal pins 21 extend downwardly from the housing 20 and are arranged in a two-dimensional matrix having columns 22 and rows 23 of terminal pins 21. Industry standards establish with accuracy the spacing and the diameter of the terminal pins 21. Typically the spacing is 0.100 inches and the terminal pin diameter is 0.018 inches. The area of the housing 20 depends upon the number of terminal pins.

A tray 10 as specifically shown in FIG. 1 is adapted to accept a PGA component with terminal pins 21 arranged in twenty-one columns 22 and twenty-one rows 23. In a typical component, the housing 20 has a maximum thickness of 0.135 inches, and the terminal pins 20 are 0.200 inches long. These dimensions are current industry standards, and they determine many of the spatial relationships in the tray 10 as will become apparent.

The tray 10 shown in FIG. 1 is an integrally molded device, typically of a conductive plastic. The conductive plastic may comprise any of a wide variety of easily molded, conductive and thermally and dimensionally stable materials. A carbon-filled polyether sulfone material is preferred. Other materials include carbon- or aluminum-filled polyether imides, polyaeryl sulfones and polyesters.

Referring now to FIGS. 1 through 4, the tray 10 has a lattice-like rigid framework 24 that divides the tray 10 into an arbitrary number of rectangular or square discrete storage pocket areas. In the particular embodiment shown in FIG. 1, the framework 24 comprises a plurality of transverse beams that define ten storage pocket areas arranged in two columns and five rows. Specifically, the framework 24 comprises a front beam 25, a parallel spaced back beam 26, a left side beam 27 and a right side beam 30 that define the periphery of the tray 10. A center beam 31 extends midway between and parallel to the front and back beams 25 and 26. Intermediate center beams 32, 33, 34 and 35 extend transversely to the front and back beams 25 and 26. As shown particularly in FIG. 1, the net effect of this particular framework 24 is a lattice with storage pocket areas 36 through 38 and 40 through 46 that individually receive PGA components.

Figure 2:
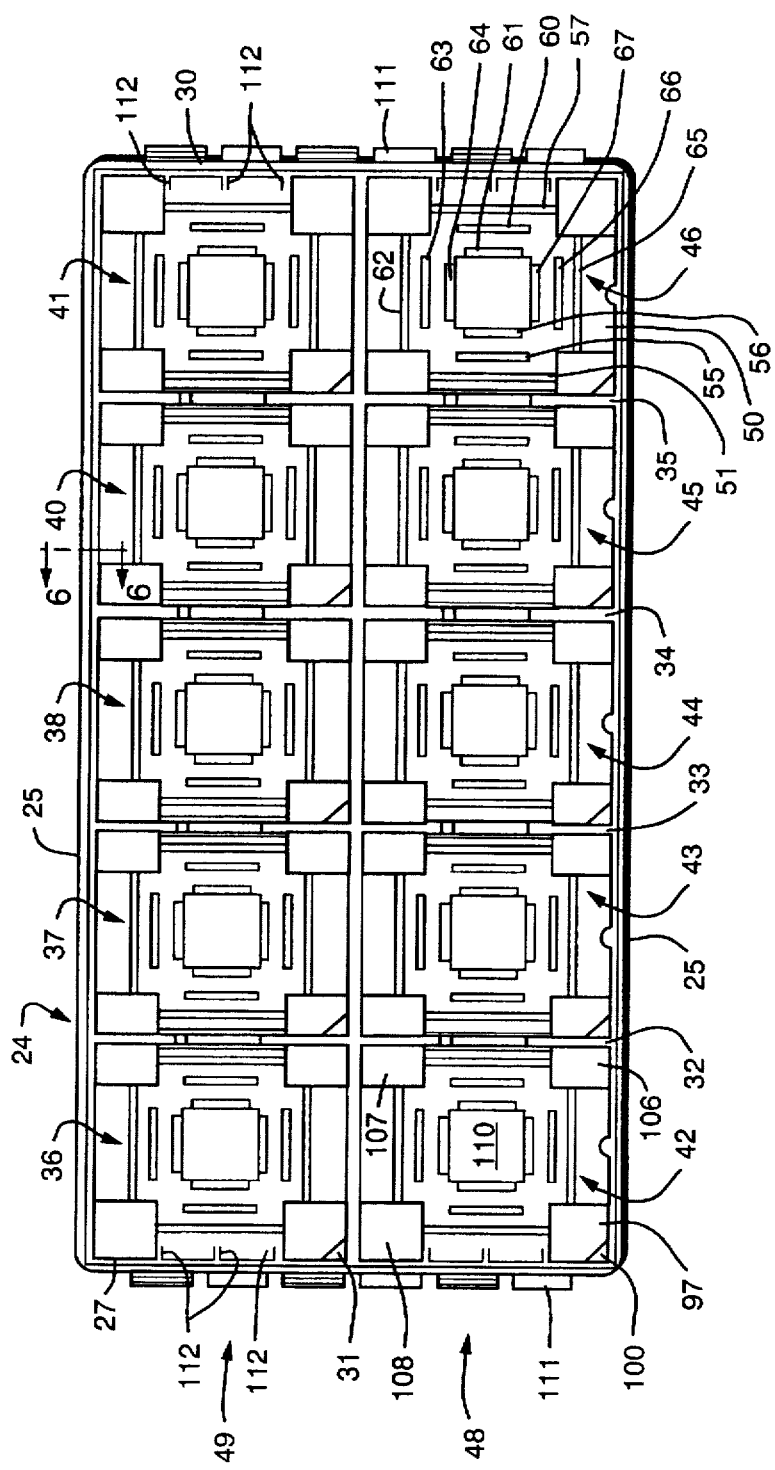
FIG. 2 is a top view of one embodiment of a storage device as shown in FIG. 1 that contains a plurality of storage areas.
Figure 3:
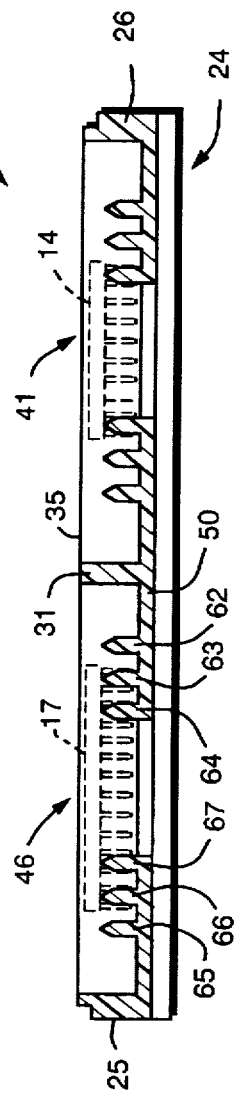
FIG. 3 is an enlarged cross-sectional view taken along lines 3—3 in FIG. 2.
Figure 4:
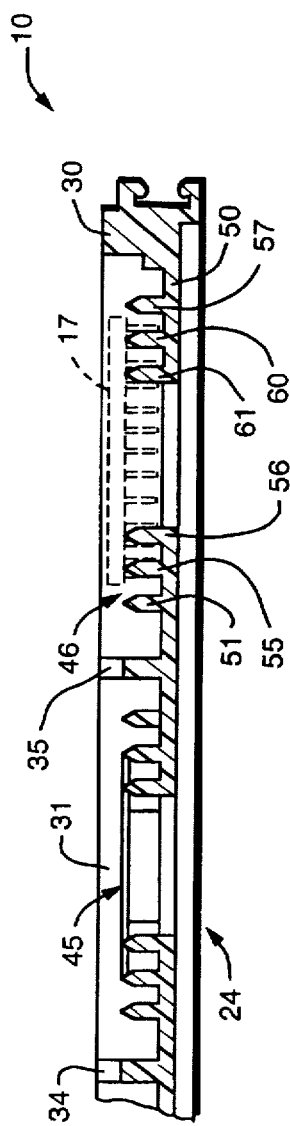
FIG. 4 is an enlarged cross-sectional view taken along lines 4—4 of FIG. 2.

The following description relates first to similar structures of each storage pocket area, in terms of the pocket storage area 46 shown in FIGS. 2 through 4, and then to differences among the various pocket storage areas. Specifically, the front beam 25, center beam 31, side beam 30 and intermediate beam 35 define the periphery storage pocket area 46 and support a base support means in the form of a planar base plate section 50. The base support plate section 50 has a cruciform shape with a plurality of integrally molded upstanding ribs extending perpendicularly to the plane of the base plate 50.

Figure 5:
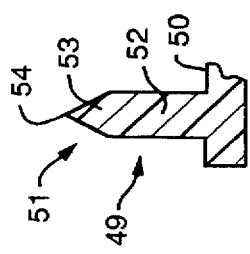
FIG. 5 is a detailed cross-sectional view of an upstanding rib means shown in FIGS. 1 through 4.

As shown in FIG. 5, each rib means 51 has a main body portion 52 that extends perpendicularly from the base plate section 50 and terminates with a tapered portion 53 defining a top surface or edge 54. This tapered rib configuration facilitates the loading of an integrated circuit into the tray. During manual loading particularly, the tapered section 53 tends to align with the terminal pins so they clear the rib 51. Moreover, width of the main body portion 52 corresponds to the predetermined clearance between pins in the adjacent columns and rows of the terminal pin array.

Referring again to FIGS. 2 through 4 and the storage pocket area 46, ribs 55 and 56 are parallel to and spaced from the rib 51. The spacings between this first group of adjacent ribs 51, 55 and 56 are a multiple of the predetermined center-line spacing for terminal pins; in this embodiment the multiple is three. The distance between the counterfacing surfaces of adjacent pairs of the ribs 51, 55 and 56 corresponds to the dimension across the outside surfaces of adjacent columns or rows of terminal pins. A second group of parallel ribs 57, 60 and 61 having similar spacing are spaced from the set of ribs 51, 55 and 56.

FIG. 4 depicts, in phantom, a PGA component 17 with its terminal pins extending downwardly. The tops of the upstanding ribs 55, 56, 60 and 61 engage the bottom of the PGA component housing along orthogonal lines and space the ends of the terminal pins from the base plate portion 50. The upstanding ribs 55, 56, 60 and 61 also are between the various terminal pins. In this figure, the integrated circuit 17 has a terminal pin array of fifteen columns and fifteen rows so the outer upstanding ribs 51 and 57 do not contact the housing of the integrated circuit 17.

Still referring to FIGS. 2 through 4, the pocket storage area 46 additionally comprises a third group of upstanding ribs 62, 63 and 64 and a fourth set of upstanding ribs 65, 66 and 67. These ribs are parallel to each other and the third and fourth groups are spaced from each other. As a result the first and second group of ribs 51, 55, and 56 and 57, 60 and 61 are transverse to the third and fourth groups of ribs 62, 63 and 64 and 65, 66 and 67.

The ribs 51, 62, 57 and 65 constitute a set of upstanding ribs, and the locus of this set of upstanding ribs is a rectangle, in this particular embodiment a square. The individual ribs of this set occupy only intermediate portions of the sides of the locus. Likewise, the locus of a second set of upstanding ribs 55, 63, 60 and 66 is a smaller concentric square. The locus of a third set of ribs 56, 64, 61 and 67 is a smaller concentric square.

Thus, the upstanding rib means in any set are coextensive with intermediate portions of the sides of a rectangle or square that is concentric with and spaced from a rectangle or square that is the locus of another set of upstanding ribs. The spacing between the corresponding upstanding ribs in adjacent sets is a multiple of the spacing between the terminal pins; in this embodiment the multiple is two.

As each upstanding rib is coextensive with only a portion of the side of its respective locus, the corners are open or free of any ribs. This open construction provides two advantages. First, it enables the tray 10 to support PGA components having either an odd or even number of rows and columns of terminal pins. PGA components with an odd number of columns and rows center in the pocket storage area; those with even number offset diagonally from the center. Some PGA components have standoff pads at the corner pins, and this construction prevents the ribs from contacting such standoff pads.

The center spacings between opposed groups of parallel ribs, such as the distance between the upstanding ribs 56 and 61 in the first and second groups, also corresponds to terminal pin spacing. In the specifically disclosed example, the center-line distance between the upstanding ribs 56 and 61 is nine times the terminal pin center-line spacing.

It now will be apparent that the tray 10 fulfills several objectives of this invention. The upstanding ribs adapt the tray for storing and transporting PGA components. A single tray with plural sets of upstanding ribs can store PGA components of various sizes. The tray 10 minimizes the problems of mechanical shock because components of force transverse to the general plane of the tray 10 transfer to the PGA component through several paths and thereby tend to divide before they reach the PGA terminal pins. More specifically, the tray 10 tends to apply force components in the plane of the tray equally to multiple terminal pins adjacent the upstanding ribs. Thus, shock forces dissipate before they reach any individual terminal pin. The spacing between the ends of the terminal pins and a lower tray edge represented by the base plate section isolates axial forces from reaching the terminal pins. Finally, the construction of integrally molded conductive plastic minimizes the potential for accumulating an electrostatic charge on the PGA component.

Figure 6:
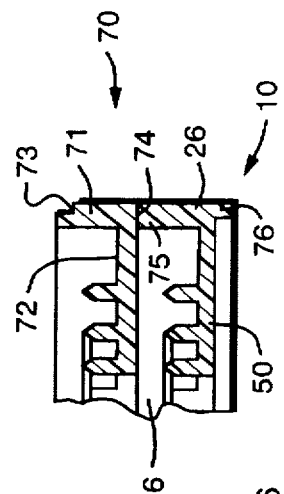
FIG. 6 illustrates a portion of the periphery of a multiple devices as shown in FIG. 1 in a stacked relationship.

FIG. 6 is a detail along a section line 6—6 in FIG. 2 that illustrates portions of two trays in a stack. Particularly, FIG. 6 depicts a tray 70 stacked on the tray 10 with its back beam 26. The tray 70 has an back beam 71 and a base plate section 72. The back beam 71 and the front and side beams of the tray 70 have a shoulder 73 formed along their respective lengths. The back beams 70 and 26 have downwardly extending lips 75 and 76, respectively. The other outer beams also contain lips. Thus, as a tray 70 is positioned over a tray 10, lip sections, such as lip section 75 engage the respective shoulder section 74 of the tray 10. This interlocks the periphery of the trays 10 and 70 locking them together in a lateral direction. The depth of each pocket storage area, such as the pocket storage area 46 shown in FIG. 4, is selected to the base support section 72 of the upper tray 70 does not interfere with or contact a PGA component housing supported in the lower tray 10.

The tray 10 of FIG. 1 and templates facilitate the manual placement of PGA components in the tray. FIG. 1 depicts a template 81 overlying storage pocket areas 37 and 43 and a template 82 spaced above storage pocket areas 46 and 42. The template 80 has a planar frame 82 with a vertical keyway 83 formed at one end and longitudinally extending lips 84 and longitudinally extending lips 85 extending from the opposite ends of the frame 82. Two central openings 86 and 87 conform generally to a specific package outline for a PGA component. In this specific embodiment, for example, the templates 80 and 81 position 15×15 PGA components.

An upstanding handle 90 traverses the center of the panel 82 for facilitating the template by aligning the template with the center beam 31. The template 80 engages the beam 31 at a slot 91 through the opposite surface of the template 80 in the plane of the handle 90. As an operator moves the template 80 toward the tray 10, the keyway 83 engages a key 92. The key 92 has a semi-cylindrical shape and is centered in the pocket storage area 42. The storage pocket areas 43, 44, 45 and 46 have storage keys. When the slot 91 engages the central beam 31, the fingers 84 and 85 engage the front beam 25 and the back beam 26 respectively to align the template 80 above the pocket storage areas 36 and 42. This places the template in the position shown in FIG. 2 with the template 81 overlying the pocket storage areas 37 and 43.

Thus the square apertures through the template 81 are accurately aligned with respect to the upstanding ribs in each of the storage pocket areas 37 and 43. It then is possible to accurately position the integrated circuit 11 by lowering it through an aperture until the tapered end portions of the upstanding ribs, such as the tapered end portion 43 in FIG. 5, interact with the depending terminals pins. When the PGA component rests on the ribs, the tray precisely positions the terminal pins with respect to the tray 10.

Centrally disposed slots or access passages between adjacent pocket storage areas facilitate manual removal of the PGA components. For example, the intermediate beam 32 has a slot 94 formed in the upper surface centrally with respect to pocket storage areas 36 and 37. A centrally disposed slot 95 centers along the intermediate beam 32 with respect to the pocket storage areas 42 and 43. These slots enable an individual to grasp the edge of a PGA component more readily.

As previously indicated and shown in FIGS. 1 and 2, each of the bottom panels, such as the base plate section 50 in the pocket storage area 46, has a cruciform shape defined by corner apertures. A corner aperture 97 additionally has a diagonal fillet 100 that provides a visual reference for purposes of alignment. This, and similar fillets in each pocket storage area coact with corresponding chamfers on each template, such as the chamfer 101 on the template 80 as shown in FIG. 1, to facilitate component orientation. Specifically, the orientation between the template 80 and the pocket storage areas 35 and 42 is proper if the chamfer 101 and the fillet 100 align. Moreover, some PGA components may have a chamfered corner, such as a chamfered corner 102 formed on the housing 20. This further facilitates correct alignment and orientation when the various diagonal surfaces align.

The front beam 25 of the lattice framework shown in FIG. 1 has a slot or pick point 103 formed proximate the pocket storage area 42 and a similar pick point 104 proximate the pocket storage area 46. Similar constructions on the back beam 26 facilitate automated handling of the trays, even in a stacked position.

The front beam 25 contains a centrally disposed vertical depression 105. When trays are stacked properly, the depressions in all the trays align. A misalignment is apparent visually because such a misalignment breaks the general line formed by the depressions that exists when all the trays are oriented in the same position in the stack.

In automatic production facilities, robotic devices can place integrated circuits in a tray or remove them for placement in a chip carrier or a printed circuit board. This requires dimensional stability in order that if such robotic devices the relationship between a reference point on the tray and the terminal pin positions remain fixed and predictable.

The tray 10 in FIG. 1 has certain construction characteristics that provide the necessary dimensional stability. First, the molded materials themselves have dimensional stability. Second, in the tray 10, as shown in FIG. 2, the bottom base plate sections in the storage packet areas 36, 37, 40, 41, 42, 43, 45 and 46 connect only to three of the lattice work beams defining each storage pocket area. For example, the base plate section 50 in the storage pocket area 46 connects only to the beams 31, 30 and 26. There is a clearance space between the base plate section 50 and the beam 35. As a tray cools after molding, these clearances allow the base plate section to cool without the introduction of fixed internal stresses that could distort the tray 10. The open structure of the upstanding ribs also contributes to dimensional stability because thermal expansion or contraction will tend to lengthen or shorten each rib independently of the other ribs. This minimizes any stress transfers as could occur if the ribs in a square or rectangle were joined at the corners. Thus the tray 10 remains flat during use.

As a third step, the storage location 42, by way of example, includes the corner aperture 97 and corner apertures 106, 107 and 108 and these apertures produce the cruciform shape of the base plate sections. A central aperture 110 extends between the upstanding ribs on the inner square. Incorporating these apertures also minimizes the accumulation of internal stresses during manufacture and reduces production costs. Specifically, the apertures reduce the quantity of molding material in the tray 10. This reduces material costs. As production molding machinery must be sized for the total volume of the material in a device, this design also reduces production equipment costs.

The tray 10 shown in FIGS. 1 and 2 has additional elements that conform the tray 10 to industry standards. For example, industry standard clips 111 extend from each of the end beams 27 and 30. However, it also can be important that the effective size of each of the pocket storage areas be identical. The tray 10 shown in FIGS. 1 and 2 includes a means for providing such uniform effective pocket storage area sizes without a need for custom designing each tray. The storage pocket areas 37, 38, 40, 43, 44 and 45, have equal areas defined by the lattice framework 24. In the specific embodiment shown in FIG. 2, however, the areas defined by the beams at the pocket storage areas 36, 41, 42 and 46 are greater. Vertically extending transverse ribs 112 formed in the beams 27 and 30 in each of pocket storage areas 36 and 41 define a vertical plane parallel to the beam 27. The ends of the ribs that define this plane are spaced from the adjacent cross beams, such as cross beam 32, the same distance as the distance between adjacent cross beams 32 and 33, for example. Thus the overall effective area for storing PGA components is the same for each storage pocket area. The design of a specific tray is readily adapted because it is only necessary to define the depth of the ribs 112 to provide a uniform cross-section for all the storage pocket areas. Moreover, the ribs 112 define an effective surface without the addition of significant quantities of molding materials.

Figure 7:
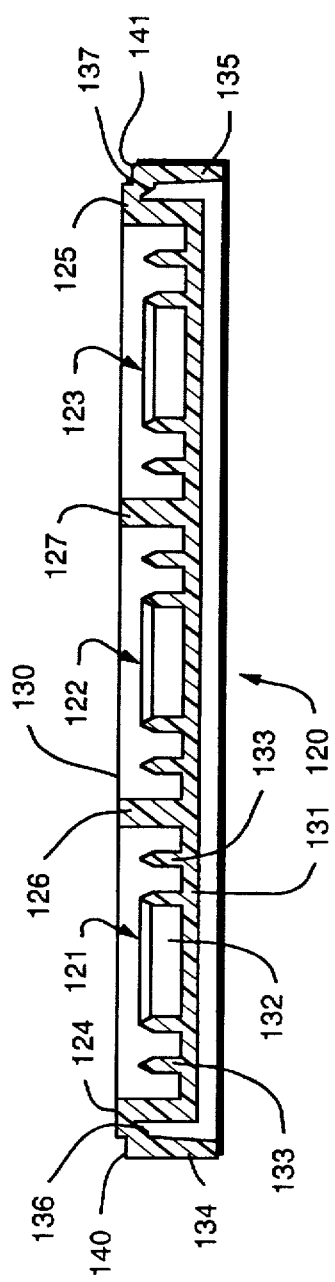
FIG. 7 is a cross-sectional view analogous to the view in FIG. 3 that depicts another embodiment of a device constructed in accordance with this invention.

FIG. 7 discloses an alternate tray construction that provides a greater storage density for smaller PGA components. Specifically a tray 120 in FIG. 7 stores PGA components in three rows and seven columns for a total of twenty-one storage pocket areas. The cross-section shown in FIG. 7 depicts three storage pocket areas 121, 122 and 123 for receiving PGA components with a pin array up to thirteen rows and columns. In this specific configuration, a front beam 124 and back beam 125 form a portion of a lattice framework with intermediate beams 126 and 127. A series of transverse beams including a beam 130 define column positions for the different storage pocket areas.

Referring to storage pocket area 121, a base plate section 131 spans the beams 124, 126 and the outer beam (not shown) that defines the storage pocket area 121. A first set of upstanding ribs 132 lie on the sides of an inner square and a second set of ribs 133 lie on an intermediate portions of an outer square thereby to define two sets of upstanding rib means with the rib means in each set being coextensive with intermediate portions of the sides of a square that is concentric with and spaced from another square defined by the other set of upstanding rib means. The construction and spacing of the rib means is the same as in the structure shown in FIG. 1.

When, for example, such a configuration is sized for a 13×13 matrix PGA component, the overall dimension between the front and back beams 124 and 125 is less than the required overall dimension for an industry standard tray. In this particular embodiment the tray is enlarged to standard size by the use of outer beams 134 and 135 and spacing web portions 136 and 137. The juncture of the web portions 136 and 137 form shoulders 140 and 141 respectively that receive the bottom lip extensions of the outer beams corresponding to beams 134 and 135 of a tray stacked above the tray 120.

In this particular embodiment the base plate section 131 extends from the four beams that define each storage pocket area. Clearances, such as the clearance between the base support 50 and the intermediate beam 35 in FIG. 2, may not be necessary because the decreased percentage of the base support area to the total area of each pocket storage means can permit cooling of an injection molded tray without the introduction of permanent stresses that could otherwise deform the tray.

The trays shown in FIGS. 1 through 7 therefore meet several objectives of this invention. They are economical to produce because they require a minimal amount of molding material and reduce the size and cost of the equipment required to mold the trays. The trays are dimensionally stable so automated production equipment can accurately determine the location of each upstanding rib in the tray from a reference position on the tray. The tapered upstanding ribs minimize any potential for damage to terminal pins during manual or automatic loading and support a PGA component housing with the ends of the depending terminal pins spaced from the tray. This blocks the transfer of forces acting along the axis of the pins to the pins. Lateral forces tend to be distributed among several pins thereby to minimize any potential for damage. The trays constructed in accordance with this invention are stackable to allow the bulk storage of a number of trays. Each tray can store PGA components in a wide range of package sizes.

Figure 8:
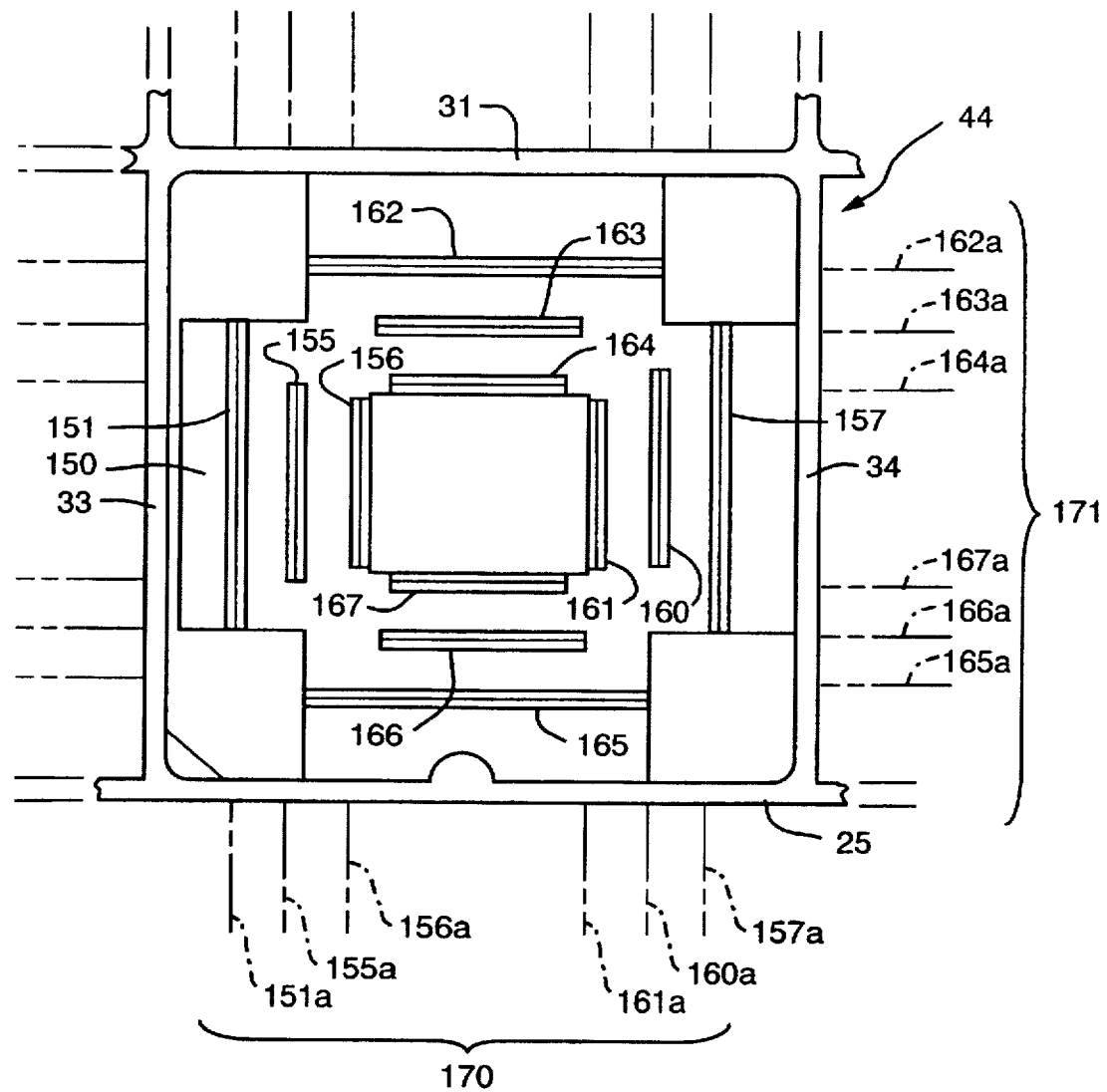
FIG. 8 is an enlarged top view of one storage area shown in FIG. 2.

FIG. 8 is an enlarged top view of a single storage pocket area, namely the storage pocket area 44 that will facilitate a further understanding of this invention. Using the same reference numerals assigned to components in the storage pocket area 46 incremented by 100, the storage pocket area 44 includes beams 25, 31, 33 and 34 and a base support 150 that spans the framework. The base support 150 carries a first set of upstanding ribs 151, 155 and 156. Each of these ribs lies on a corresponding rib axis 151A, 155A and 156A respectively. Another set of ribs 157, 160 and 161 lie along rib axes 157A, 160A and 161A. Similarly, ribs 162 through 167 lie along rib axes 162A through 167A respectively.

Each rib therefore lies along its own rib axis. Certain of the rib axes, namely the rib axes 151A, 155A through 157A, 160A and 161A constitute a first set 170 of rib axes. The rib axes 162A through 167A constitute a second set of rib axes 171. The rib axes in set 170 parallel each other and the spacing between the axes is determined by the spacing between the terminal pins 23 in FIG. 1. Similarly, the rib axes in set 171 are parallel to each other with a spacing that corresponds to the spacing between the rows of terminal pins 23 in FIG. 1. Each rib axis in the set 170 parallels beams 33 and 34 while each rib axis in the second set 171 parallels beams 25 and 31. Consequently, the rib axes in the set 170 intersect the rib axes in the set 171 and in this particular embodiment the intersections are at substantially 90°.

Figure 9:
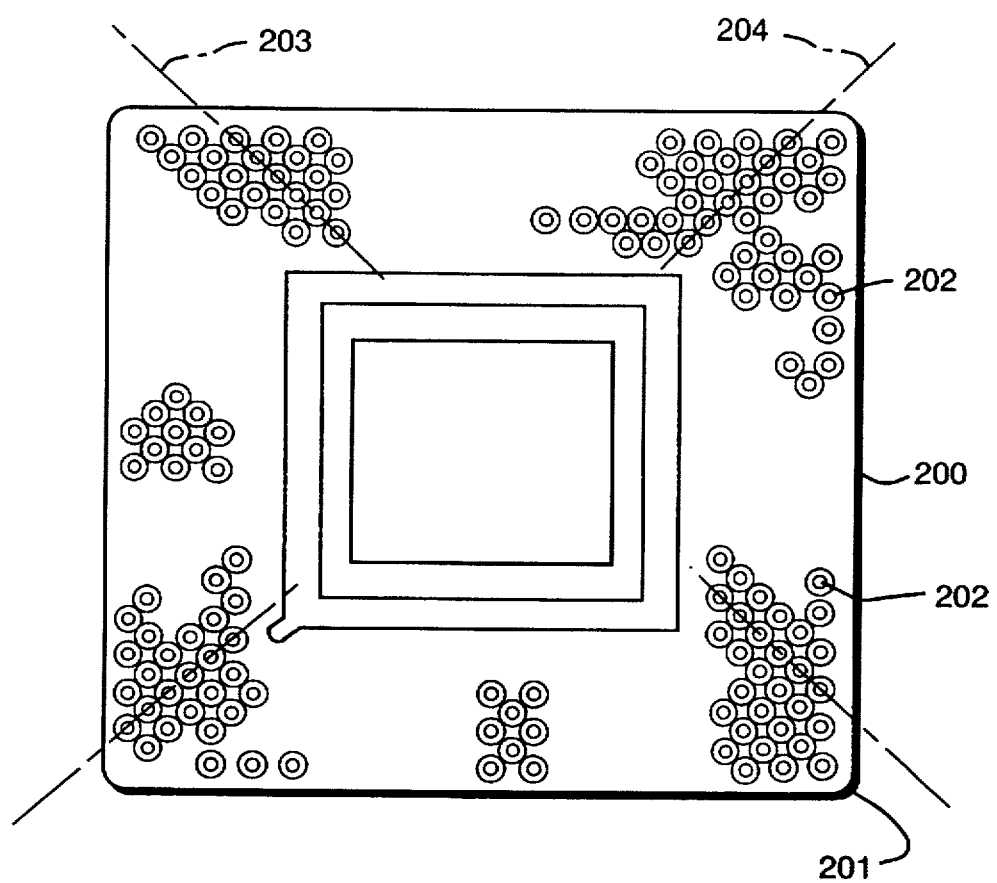
FIG. 9 is a bottom plan view of another embodiment of a component that can be stored in a device embodying this invention.

FIG. 9 discloses another embodiment of a PGA component 200 that includes a planar housing 201. Whereas the rows of terminal pins 23 in the PGA component 20 of FIG. 1 lie along axes that are at right angles to the edge of the PGA housing 20, terminal pins 202 in the PGA component 200 in FIG. 9 lie along intersecting diagonal rows, diagonal rows 203 and 204 being representative of those rows. Like the terminal pins 23 in the PGA component 11, the terminal pins 202 extend a predetermined length from the housing 201 and are normal to the plane of that housing.

Figure 10:
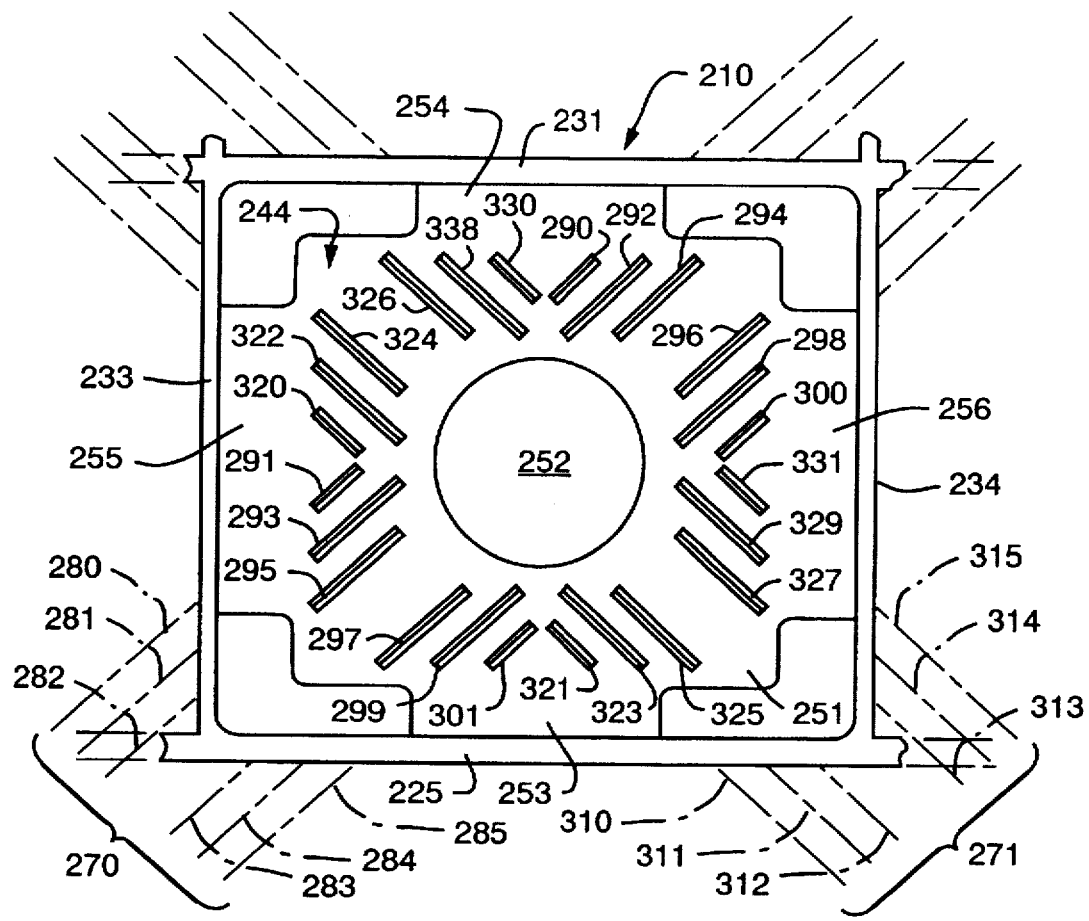
FIG. 10 is an enlarged view of one storage area of another embodiment of the device for storing the component shown in FIG. 9.
Figure 11:
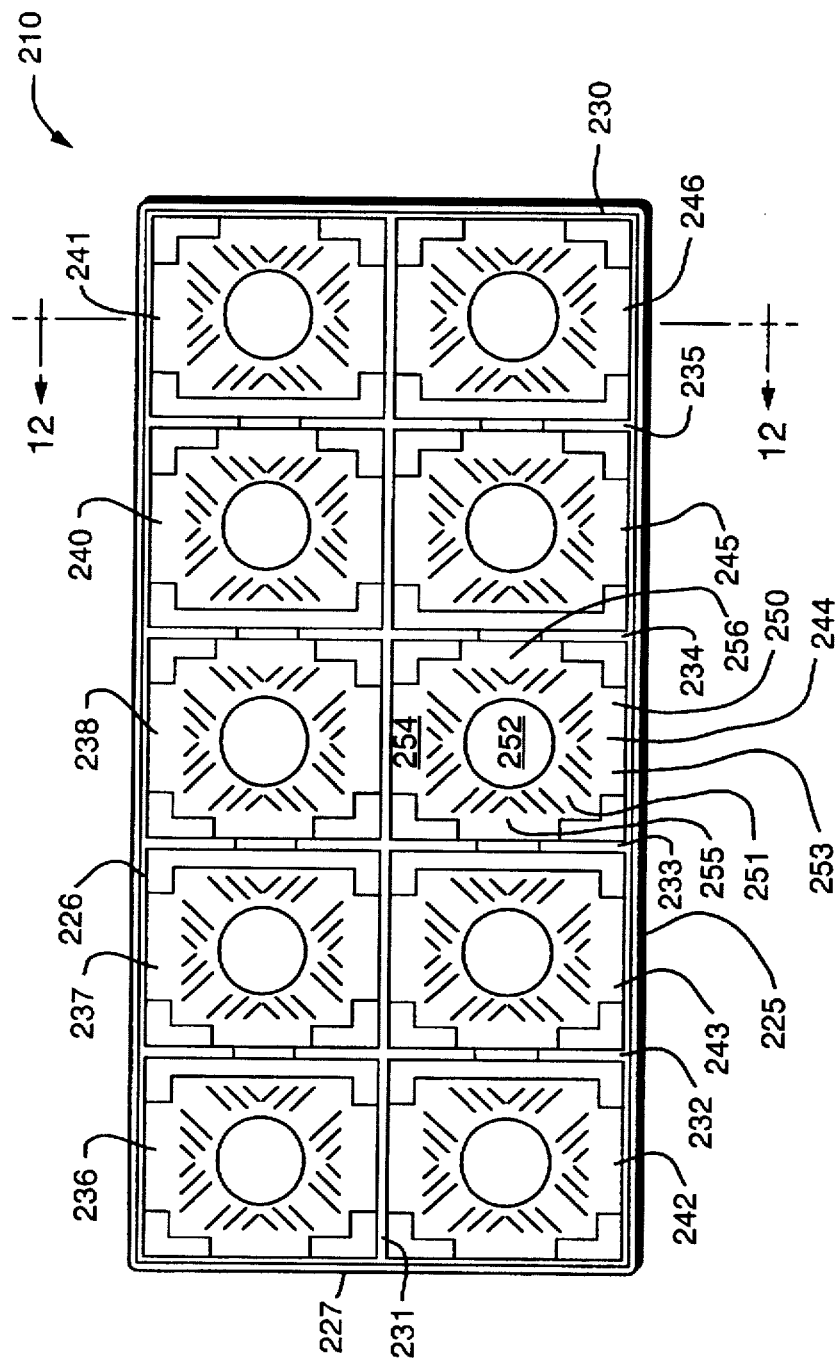
FIG. 11 is a top view of a device that is adapted for storing a plurality of components as shown in FIG. 9.
Figure 12:
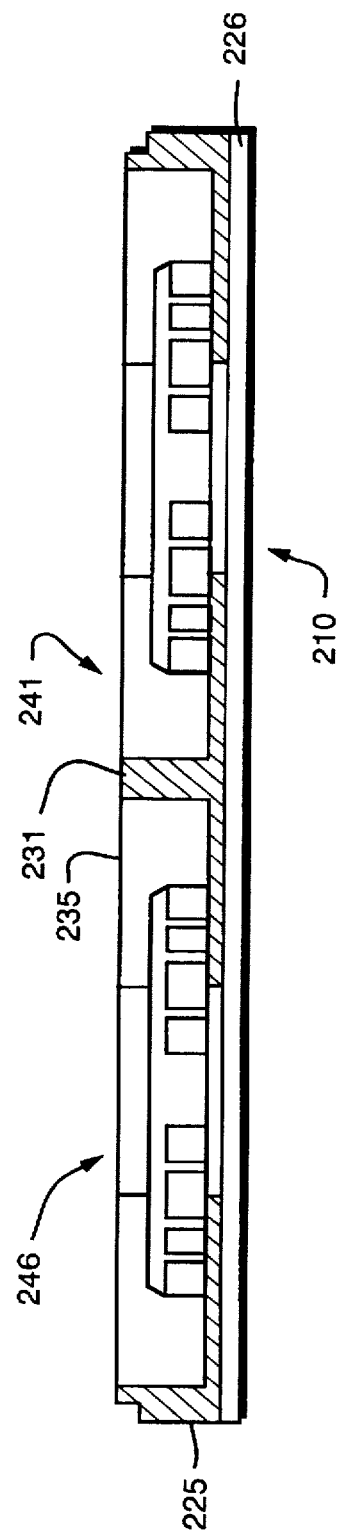
FIG. 12 is an enlarged sectional view taken along lines 12—12 in FIG. 11.

FIGS. 10 through 12 disclose another embodiment of a tray that is particularly adapted for storing PGA components of the type shown in FIG. 9. More specifically this tray, designated with reference numeral 210, includes an open framework that defines the periphery of a plurality of storage pocket areas. Specifically, a front beam 225, a parallel back beam 226 and left and right side beams 227 and 230 define the outer periphery of the tray 210. A center transverse beam 231 parallels the front and back beams 225 and 226. Additional intermediate beams between the front and back beams 225 and 226 and include a left intermediate beam 232, a left center beam 233, a right center beam 234 and a right intermediate beam 235. Like the tray 10 shown in FIG. 1, these various beams form a plurality of storage pocket areas 236 through 238 and 240 through 246.

Referring to the storage area 244 shown in enlarged form in FIG. 10, an integrally molded plate section 250 forms a base support that spans the adjacent framework beams. The plate 250 has a central portion 251 and a central aperture 252. The plate section 250 connects to and spans adjacent beams that define the periphery of the pocket storage area by means of tab extensions of the plate section 250. Specifically in the storage pocket area 244, tab 253 extends from the central portion 251 to the front beam 225; tab 254, to the center transverse beam 231; tab 255, to the left center beam 233; and tab 256, to the right center beam 234.

Still referring to FIG. 10, the storage pocket area 244 includes upstanding ribs lying along a first set 270 and a second set 271 of rib axes. The rib axes in each set are parallel and spaced. The axes in the sets 270 and 271, like the first and second sets 170 and 171 of axes shown in FIG. 8, intersect. However, the sets of axes 270 and 271 are oblique to the beams that form the pocket storage area, such as the beams 225, 231, 233 and 234 that form the storage pocket area 244. In this particular embodiment the pocket storage area 244 has a square configuration so the axes in each of the sets 270 and 271 intersect each other substantially at right angles.

Each rib axis in the sets 270 and 271 locates at least one upstanding rib, usually having a tapered form that is analogous to the form shown in FIG. 5. For example, the first set 270 of rib axes include individual parallel axes 280 through 285. Two spaced upstanding ribs 290 and 291 lie along the rib axis 280. Upstanding ribs 292 and 293 lie along the axis 281; ribs 294 and 295, along axis 282; ribs 296 and 297, along axis 283; ribs 298 and 299 along axis 284; and ribs 300 and 301, along rib axis 285. Similarly, the second set of rib axes 271 comprises parallel axes 310 through 315. Ribs 320 through 331 are located in pairs along each of the axes 310 through 315 respectively.

Referring to FIGS. 10 and 11, a first locus of the outward axial terminations of each upstanding rib defines an outer rectangle nested within the storage pocket area 244. Likewise, a second locus of the inner axial terminations of certain of the ribs defines an inner nested square or rectangle. The inner terminations of ribs lying on the outer rib axes in each set, such as the ribs 290 on the axis 280 and the rib 321 on the axis 310, lie at a center line or axis through the storage pocket area. The locus of these terminations is a square or rectangle that is spaced from the inner square or rectangle defined by the inner edges of other upstanding ribs. If the spacing of individual ones of the rib axes in each of the sets 270 and 271 corresponds to the spacing between the terminal pin axes shown in FIG. 9, the storage pocket area 244 shown in FIG. 10 and each of the other storage pocket areas shown in FIG. 11 will receive a PGA component such as shown in FIG. 9 with the same advantages as the tray 10 shown in FIG. 1.

Figure 13:
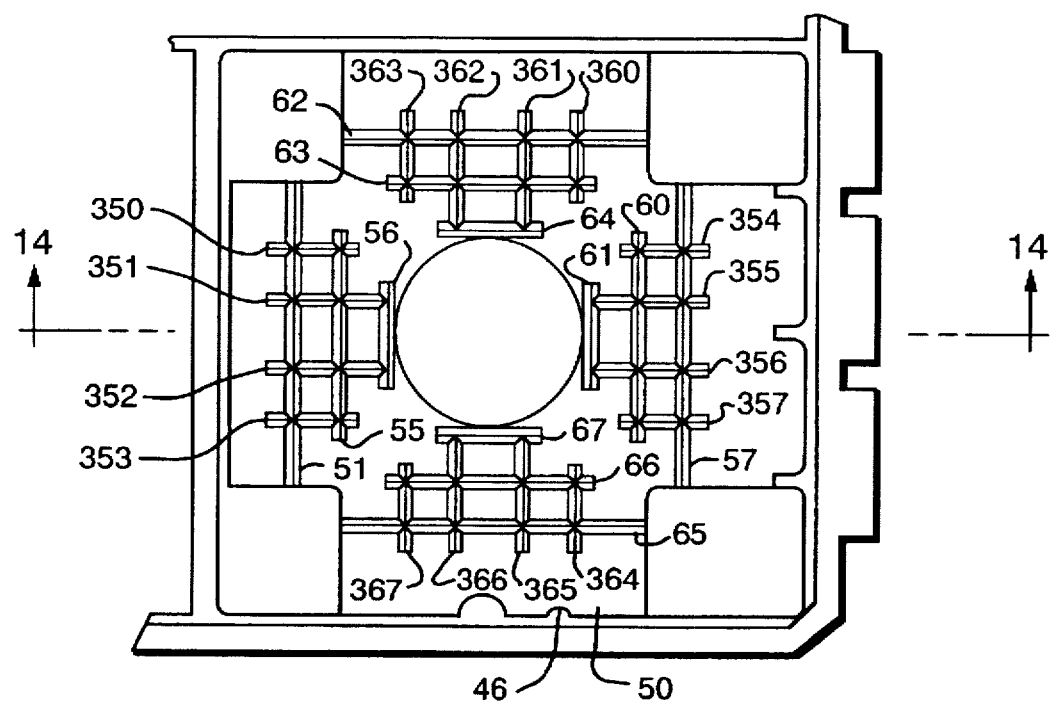
FIG. 13 is a top view of another embodiment of a storage area for supporting a device of the type shown in FIG. 1.
Figure 14:
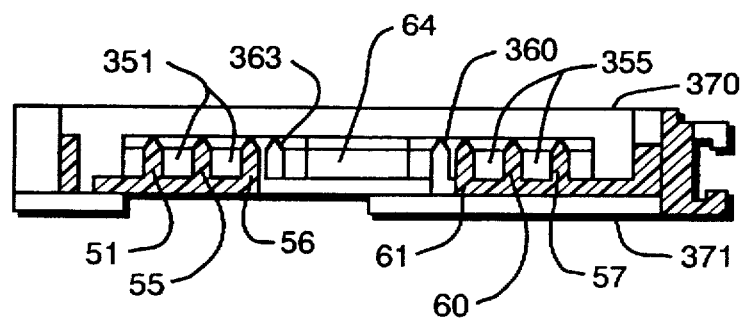
FIG. 14 is a view taken along lines 14—14 of the embodiment shown in FIG. 13.

FIGS. 13 and 14 disclose a third embodiment of a tray that is particularly adapted for storing PGA components of the type shown in FIG. 1. More particularly, FIGS. 13 and 14 depict a modified structure of a pocket storage area 46. In the following discussion like reference numerals refer to the corresponding elements in FIGS. 1 through 7. It will also be apparent that each of the pocket storage areas shown in FIG. 1 could be modified in accordance with the modification to storage pocket area 46 shown in FIGS. 13 and 14.

More specifically, the storage pocket area includes the upstanding ribs 51, 55 through 57, 61 through 67 of FIGS. 1 through 7. The upstanding ribs 51, 55 through 57 and 61 lie on a first set of spaced parallel axes. Upstanding ribs 62 through 67 lie on a second set of axes. The first and second axes intersect. In this particular embodiment the intersecting angle is 90°.

Additional ribs lie along additional spaced axes in the first and second sets. For example, upstanding ribs 350 through 357 lie along the same set of axes as the upstanding ribs 62 through 67. Similarly upstanding ribs 360 through 367 lie along a set of axes that are parallel with the axes in the set containing the upstanding ribs 51, 55 through 57, 60 and 61. The upstanding ribs 350 through 353 not only lie on axes that intersect the axes of the upstanding ribs 51, 55 and 56, but the upstanding ribs 350 through 353 physically intersect with certain of the upstanding ribs 51, 55 and 56. More particularly, the upstanding ribs 350 and 353 intersect the upstanding ribs 51 and 55 while upstanding ribs 351 and 352 intersect upstanding ribs 51, 55 and 56. Similar patterns occur at the other three basic locations in the storage pocket area 46. That is, upstanding ribs upstanding 354 and 357 intersect upstanding ribs 57 and 60; upstanding ribs 355 and 356, upstanding ribs 57, 60 and 61. Upstanding ribs 360 and 363 intersect upstanding ribs 62 and 63; upstanding ribs 361 and 362 intersect upstanding ribs 62, 63, and 64. Upstanding ribs 364 and 367 intersect upstanding ribs 65 and 66; upstanding ribs 365 and 366 upstanding ribs 65, 66 and 67.

Thus the configuration in FIGS. 13 and 14 comprises upstanding ribs lying along first and second sets of spaced parallel axes. Some axes contain a single upstanding rib, such as the axes that are coincident upstanding ribs 57, 60 and 61. Other axes contain a plurality of upstanding ribs such as the axes that are coincident with the upstanding ribs 350 through 357 and 360 through 367. This array of intersecting ribs provides a grid of open rectangular openings or recesses. The upstanding ribs support a component housing; and the openings receive the terminal pins.

Each upstanding rib has the same structure. Each upstanding rib has a tapered upper portion terminating in an edge for engaging the bottom of the housing. This configuration also is characterized in that the framework has an overall profile or volume, defined by an upper edge 370 and a lower edge 371, and supports the housing so the terminal pins are confined within that profile. These factors increase the bearing surfaces for terminal pins. Consequently this open matrix structure minimizes affects of shock forces applied in the plane of the tray.

Therefore in accordance with the various objects and advantages of this invention, there are disclosed diverse trays for supporting electronic components having planar housing and a plurality of terminal pins depending therefrom in a pattern of linear or oblique rows. Each of the embodiments of the trays shown in FIGS. 1 through 8 and the embodiments shown in FIGS. 10 through 14 have the same general structure. Namely, each includes a tray that has a rigid framework that supports a plurality of upstanding ribs that are adapted to extend between the individual rows of terminal pins to engage the bottom of the housing. Certain ribs lie on a first set of spaced parallel rib axes. Others lie along a second set of spaced parallel rib axes. The rib axes in the first and second sets intersect and the spacing between adjacent parallel ribs corresponds to the predetermined spacing between the rows of terminal pins in the component. As a result the upstanding rib means align between adjacent terminal pin rows to engage the housing and support the integrated circuit component in each storage pocket area.

These trays can be constructed of a number of different materials. As described with respect to the embodiment of FIGS. 1 through 8 and equally applicable to the embodiment of FIGS. 10 through 12 and FIGS. 13 and 14, each can be molded from filled dimensionally stable thermoplastic material. As previously indicated, such a material can include those materials taken from the group consisting of polyether sulfones, polyether imides, polyaeryl sulfones and polyesters having a filler from the group consisting of carbon and aluminum. Styrenes such as acrylonitrile butadiene styrene, also are acceptable.

It also will be apparent that a number of modifications can be made while obtaining some or all of the advantages of this invention. For example, a tray may include different structures for defining storage pocket areas of differing configurations. The upstanding rib means may have the disclosed taper, a different taper or no taper. The depth of each storage pocket area may have a different relationship to both the terminal pin length and overall height of the component. Still other materials may be substituted for the specifically disclosed materials. Therefore, it is the intent of the appended claims to cover all such variations and modifications as come within the true spirit and scope of this invention.

What is claimed as new and desired to be secured by Letters Patent of the United States is:

1. A tray for storing a plurality of integrated circuit components wherein each integrated circuit component has a planar housing having edges and first and second parallel housing surfaces and an array of terminal pins of a predetermined length depending from the first housing surface in predetermined column and row positions with predetermined spacings, said tray comprising:

A. first and second pluralities of upstanding planar ribs for engaging the integrated circuit component first housing surface, said first plurality of upstanding ribs lying on a first set of spaced, adjacent parallel rib axes and said second plurality of upstanding ribs lying along a second set of spaced, adjacent parallel rib axes, the rib axes in said first set intersecting the rib axes in the second set and the spacing between adjacent parallel rib axes corresponding to the predetermined spacings between the terminal pin column and row positions, each upstanding rib being positioned relative to an adjacent upstanding rib to align and interpose between different pairs of adjacent terminal pin rows and terminating at an upper edge thereby to define a support for the integrated circuit component; and B. a framework including first and second intersecting beam means for supporting said plurality of upstanding ribs, said first and second sets of rib axes being oblique to said first and second beam means.

2. A tray as recited in claim 1 wherein said framework includes support means defining a plurality of storage pocket areas and base support means at each said storage pocket area spanning portions of said framework for supporting each of said upstanding ribs, each of said upstanding ribs having a height from said base support means that exceeds the predetermined length, each of said beam means forming the periphery of a pocket storage area having a depth that exceeds the height of said rib means.

3. A tray as recited in claim 2 wherein said tray is molded from an insulating, filled, dimensionally stable thermoplastic material.

4. A tray as recited in claim 3 wherein said thermoplastic material is taken from the group consisting of styrenes, polyether sulfones, polyether imides, polyaeryl sulfones and polyesters having a filler from the group consisting of carbon and aluminum.

5. A tray as recited in claim 4 wherein said first and second sets of axes intersect said first and second beams at an angle of substantially 45°.

6. A tray as recited in claim 1 wherein at least one of said rib axes has a plurality of discrete ribs spaced thereon.

7. A tray for storing a plurality of pin grid array integrated circuit components, each integrated circuit component having a planar rectangular housing with peripheral edges and first and second spaced parallel planar surfaces and an array of terminal pins depending from the first housing surface for a predetermined length in at least three rows that lie along terminal pin axes, that are oblique to the edges of the housing and that have predetermined row spacings, said tray comprising:

A. framework means for defining peripheries of a plurality of coplanar storage pocket areas, B. base support means at each said storage pocket area for spanning portions of said framework means thereby to form therewith said storage pocket areas, and C. first and second pluralities of upstanding ribs within each storage pocket area extending from said corresponding base support means, said first plurality of said upstanding ribs lying on a first set of spaced, adjacent parallel rib axes and said second plurality of said upstanding ribs lying along a second set of spaced, adjacent parallel rib axes, the rib axes in said first set intersecting the rib axes in the second set and the spacing between adjacent parallel rib axes corresponding to the predetermined row spacing and the first and second rib axes being oblique to said framework means whereby each upstanding rib in a given pocket storage area is positioned to align between a different pair of adjacent terminal pin rows and engage the planar housing for supporting the integrated circuit component in said storage pocket area with the housing parallel to said framework means.

8. A tray as recited in claim 7 wherein each of said upstanding ribs has a height from said base support means that exceeds the predetermined length.

9. A tray as recited in claim 8 wherein each of said ribs in a pocket storage area terminates in a tapered portion that parallels said corresponding base support means.

10. A tray as recited in claim 7 wherein said tray is molded from an insulating, filled, dimensionally stable thermoplastic material.

11. A tray as recited in claim 10 wherein said thermoplastic material is taken from the group consisting of styrenes, polyether sulfones, polyether imides, polyaeryl sulfones and polyesters having a filler from the group consisting of carbon and aluminum.

12. A tray as recited in claim 8 wherein at least one of said rib axes has a plurality of discrete ribs spaced thereon.

13. A tray as recited in claim 13 wherein said base support means includes a central portion with an aperture therethrough and each of said ribs has inner and outer axial terminations, a first locus of said outer terminations constituting a first rectangle in said storage pocket area, a second locus of said inner terminations of certain of said ribs constituting a second rectangle between first rectangle and said aperture, the inner terminations of others of said ribs lying at a central axis of said storage pocket area and having a third locus that constitutes a third rectangle intermediate the first and second rectangles.

14. A tray as recited in claim 7 wherein one of said base plate means has a cruciform shape including a central portion and tabs extending therefrom, first tabs being connected to adjacent ones of said transverse beams that define said storage pocket area and at least one second tab terminating in a spaced relationship with respect to its proximate beam.

15. A tray as recited in claim 14 wherein a second base plate has a cruciform shape including tabs extending therefrom, all said tabs being connected to all the interconnected transverse beams that define the corresponding storage pocket area.

16. A tray as recited in claim 14 wherein at least one of said rib axes has a plurality of discrete ribs spaced thereon.

17. A tray as recited in claim 16 wherein said base support means includes a central portion with an aperture therethrough and each of said ribs has inner and outer axial terminations, a first locus of said outer terminations constituting a first rectangle in said storage pocket area, a second locus of said inner terminations of certain of said ribs constituting a second rectangle between first rectangle and said aperture, the inner terminations of others of said ribs lying at a central axis of said storage pocket area and having a third locus that constitutes another rectangle intermediate the first and second rectangles.

18. A tray as recited in claim 17 wherein each of said upstanding ribs has a height from said base support means that exceeds the predetermined distance.

19. A tray as recited in claim 18 wherein in each of said transverse beams has a height of each said base support means that exceeds the height of said upstanding ribs.

20. A tray as recited in claim 18 wherein each of said ribs in a pocket storage area terminates in a tapered edge that parallels said corresponding base support means.

21. A tray as recited in claim 20 wherein said tray is molded from an insulating, filled, dimensionally stable thermoplastic material.

22. A tray as recited in claim 21 wherein said thermoplastic material is taken from the group consisting of styrenes, polyether sulfones, polyether imides, polyaeryl sulfones and polyesters having a filler from the group consisting of carbon and aluminum.

23. A tray for storing an integrated component having a planar housing with edges and first and second planar surfaces and an array of terminal pins extending for a predetermined length from the first housing planar surface in a plurality of at least three spaced parallel rows, said tray comprising:

A. framework means for defining peripheries of a plurality of coplanar rectangular storage pocket areas, and B. first and second pluralities of upstanding planar ribs in a defined storage pocket area with free ends thereof for engaging the integrated circuit component first planar surface, said first plurality of said upstanding ribs lying on a first set of spaced, adjacent parallel rib axes and said second plurality of said upstanding ribs lying along a second set of spaced, adjacent parallel rib axes, the rib axes in said first set intersecting the rib axes in the second set and certain of said upstanding ribs lying along each of said first and second sets of axes intersecting whereby said intersecting ribs define an array of rectangular recesses for receiving the terminal pins, edges of each of said upstanding rib means supporting the first housing surface, each of said ribs being aligned to interpose between a pair of adjacent terminal pin rows.

24. A tray as recited in claim 23 wherein said framework means defines a structure with a structure volume and said free ends of said upstanding ribs define a support plane in the volume, said ribs being positioned on said framework means for confining said terminal pins to the structure volume of said framework means.

25. A tray as recited in claim 23 wherein each of said upstanding ribs has a tapered edge for engaging the component housing.

26. A tray as recited in claim 23 wherein said tray is molded from an insulating, filled dimensionally stable thermoplastic material.

27. A tray as recited in claim 26 wherein said thermoplastic material is taken from the group consisting of styrenes, polyether sulfones, polyether imides, polyaeryl sulfones and polyesters having a filler from the group consisting of carbon and aluminum.

28. A tray as recited in claim 23 wherein said framework means includes means for defining the periphery of a plurality of storage pocket areas and base support means at each of said storage pocket areas for spanning portions of said peripheral means thereby to form therewith said storage pocket areas.

29. A tray as recited in claim 28 wherein each of said upstanding ribs has a height from said base support means that exceeds the predetermined length.

30. A tray as recited in claim 29 wherein each said of ribs terminates in a tapered portion for supporting the component housing.

31. A tray as recited in claim 28 wherein said tray is molded of an insulating, filled, dimensionally stable thermoplastic material.

32. A tray as recited in claim 31 wherein said thermoplastic material is taken from the group consisting of styrenes, polyether sulfones, polyether imides, polyaeryl sulfones and polyesters having a filler from the group consisting of carbon and aluminum.

\* \* \* \* \*